United States Patent
Jeon et al.

(10) Patent No.: US 12,142,709 B2
(45) Date of Patent: Nov. 12, 2024

(54) DISPLAY DEVICE

(71) Applicant: Samsung Display Co., Ltd., Yongin-si (KR)

(72) Inventors: Hyung Il Jeon, Yongin-si (KR); Min Woo Kim, Yongin-si (KR); Sung Kook Park, Yongin-si (KR); Dae Ho Song, Yongin-si (KR); Byung Choon Yang, Yongin-si (KR); Jin Woo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 419 days.

(21) Appl. No.: 17/449,928

(22) Filed: Oct. 4, 2021

(65) Prior Publication Data

US 2022/0158038 A1 May 19, 2022

(30) Foreign Application Priority Data

Nov. 18, 2020 (KR) .......................... 10-2020-0154943

(51) Int. Cl.
*H01L 33/42* (2010.01)
*H01L 25/075* (2006.01)
*H01L 33/40* (2010.01)
*H01L 33/58* (2010.01)

(52) U.S. Cl.
CPC ............ *H01L 33/42* (2013.01); *H01L 33/405* (2013.01); *H01L 33/58* (2013.01); *H01L 25/0753* (2013.01)

(58) Field of Classification Search
CPC ..... H01L 33/42; H01L 25/0753; H01L 33/54; H01L 25/167; H01L 33/62
See application file for complete search history.

(56) References Cited

U.S. PATENT DOCUMENTS

| | | | |
|---|---|---|---|
| 6,897,855 B1 | 5/2005 | Matthies et al. | |
| 9,709,838 B2 | 7/2017 | Jung et al. | |
| 10,199,593 B2 | 2/2019 | Byun et al. | |
| 10,217,678 B2 * | 2/2019 | Liu | H01L 27/1262 |
| 10,546,516 B2 | 1/2020 | Tomoda et al. | |
| 10,700,121 B2 | 6/2020 | Liu et al. | |
| 10,714,658 B2 | 7/2020 | Lim et al. | |
| 10,784,308 B2 | 9/2020 | Kim et al. | |
| 2016/0293586 A1 * | 10/2016 | Ghosh | H01L 29/7869 |
| 2017/0250164 A1 * | 8/2017 | Takeya | H01L 27/124 |
| 2020/0212022 A1 | 7/2020 | Ahmed | |
| 2023/0045618 A1 * | 2/2023 | Kim | H01L 21/28 |

FOREIGN PATENT DOCUMENTS

| | | |
|---|---|---|
| CN | 109407406 A | 3/2019 |
| CN | 109410775 A | 3/2019 |
| JP | 2015-194515 A | 11/2015 |
| KR | 10-0570507 B1 | 9/2006 |
| KR | 10-2018-0093149 A | 8/2018 |

(Continued)

*Primary Examiner* — Mark W Tornow
(74) *Attorney, Agent, or Firm* — Lewis Roca Rothgerber Christie LLP

(57) ABSTRACT

A display device includes: a substrate; a transparent electrode on one surface of the substrate; a reflective electrode on the transparent electrode; a transistor on the reflective electrode; and a light emitting element between the transparent electrode and the reflective electrode. The transistor overlaps the light emitting element.

21 Claims, 11 Drawing Sheets

(56) References Cited

FOREIGN PATENT DOCUMENTS

| KR | 10-2019-0026440 A | 3/2019 |
|---|---|---|
| KR | 10-2019-0076221 A | 7/2019 |
| KR | 10-2019-0079147 A | 7/2019 |
| KR | 10-2039838 B1 | 11/2019 |
| KR | 10-2133914 B1 | 7/2020 |

* cited by examiner

FIG. 8
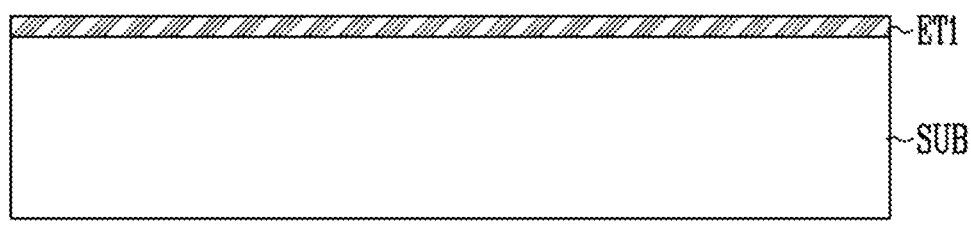
FIG. 9
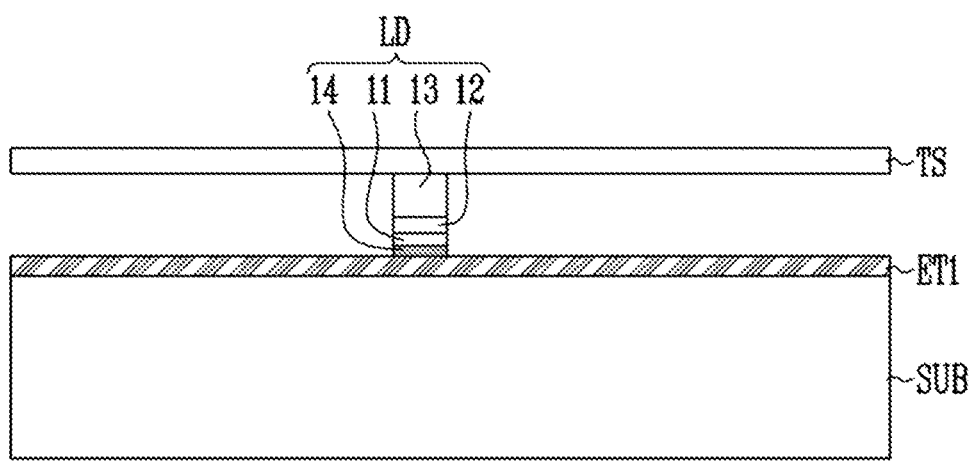
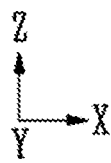

FIG. 10
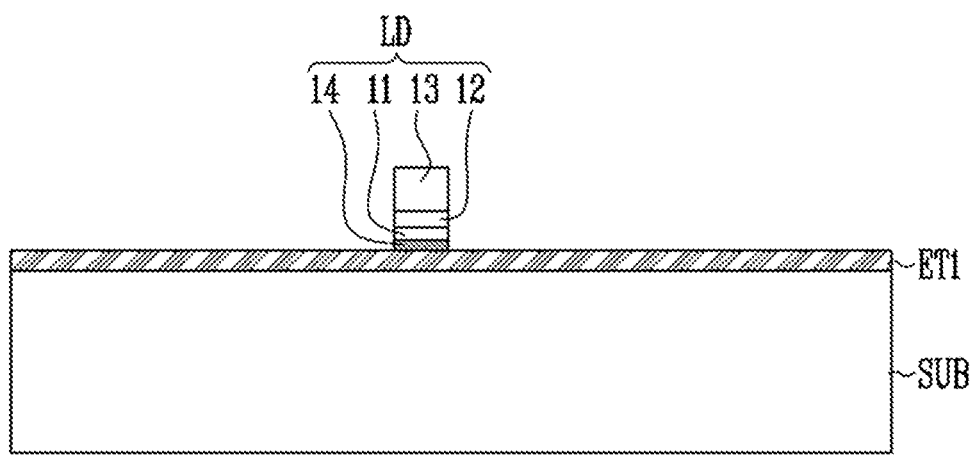
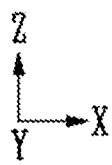

DISPLAY DEVICE

CROSS-REFERENCE TO RELATED APPLICATION

This application claims priority to and the benefit of Korean Patent Application No. 10-2020-0154943, filed in the Korean Intellectual Property Office on Nov. 18, 2020, the entire content of which is incorporated herein by reference.

BACKGROUND

1. Field

Aspects of embodiments of the present disclosure relate to a display device.

2. Description of the Related Art

Recently, as interest in information displays has increased, research and development into display devices are continuously conducted.

SUMMARY

Aspects of embodiments of the present disclosure provide a high resolution display device having improved element reliability and light emission efficiency.

Aspects and features of embodiments of the present disclosure are not limited to those mentioned above, and other aspects and features that are not mentioned may be clearly understood to a person of an ordinary skill in the art in view of the following description.

According to an embodiment, a display device including: a substrate; a transparent electrode on one surface of the substrate; a reflective electrode on the transparent electrode; a transistor on the reflective electrode; and a light emitting element between the transparent electrode and the reflective electrode. The transistor overlaps the light emitting element.

The light emitting element may include: a first semiconductor layer; a second semiconductor layer on the first semiconductor layer; and a contact electrode between the transparent electrode and the first semiconductor layer.

The contact electrode may contact the transparent electrode.

The contact electrode may include the same material as the transparent electrode.

The contact electrode may include at least one of an indium tin oxide (e.g., ITO), an indium zinc oxide (e.g., IZO), a zinc oxide (e.g., ZnO), and a zinc tin oxide (e.g., ZTO).

The first semiconductor layer may be electrically connected to the transparent electrode, and the second semiconductor layer may be electrically connected to the reflective electrode.

The transparent electrode may include at least one of an indium tin oxide (e.g., ITO), an indium zinc oxide (e.g., IZO), a zinc oxide (e.g., ZnO), and a zinc tin oxide (e.g., ZTO).

A width of the reflective electrode may be larger than a width of the light emitting element.

The reflective electrode may cover the light emitting element.

The display device may further include a planarization layer surrounding the light emitting element.

The planarization layer may be between the transparent electrode and the reflective electrode.

The reflective electrode may be directly on the planarization layer.

The transistor may include: a semiconductor layer on the reflective electrode; a gate electrode on the semiconductor layer; and a source electrode and a drain electrode on the gate electrode.

The reflective electrode may be electrically connected to the source electrode or the drain electrode.

The substrate may have a display area in which the light emitting element is arranged, and a non-display area other the display area. A pad portion may be in the display area.

The pad portion may overlap the reflective electrode.

The display device may further include a low-resistance conductive layer on the transparent electrode.

The low-resistance conductive layer may have a mesh shape.

The display device may further include a color conversion layer on the other surface of the substrate and overlapping the light emitting element; and a color filter layer on the color conversion layer.

The display device may further include a light blocking pattern surrounding the color conversion layer or the color filter layer.

Other embodiments are included in the detailed description and drawings.

According to embodiments of the present disclosure, element reliability may be improved by forming a transistor after directly bonding a light emitting element on a first electrode. In addition, light emission efficiency may be improved by forming a second electrode, which is a reflective electrode, on a light emitting element, and a high resolution display device may be easily realized by disposing a transistor to overlap the light emitting element.

Aspects and features of embodiments of the present disclosure are not limited by what is illustrated in the above and other various aspects and features are included in the present specification.

BRIEF DESCRIPTION OF THE DRAWINGS

FIGS. 8 to 13 illustrate cross-sectional views of process steps of a manufacturing method of a display device according to an embodiment.

DETAILED DESCRIPTION

Figure 1:
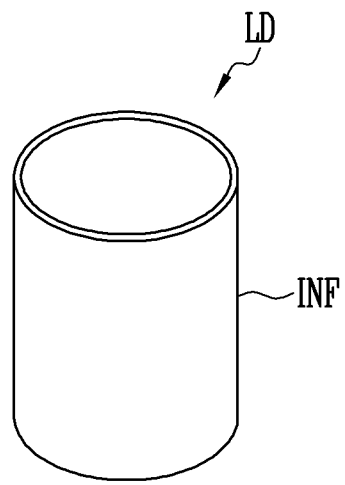
FIGS. 1 and 2 illustrate a perspective view and a cross-sectional view of a light emitting element according to an embodiment, respectively.

Aspects and features of embodiments of the present disclosure and methods of accomplishing the same may be understood more readily by reference to the following detailed description of example embodiments and the accompanying drawings. The present disclosure may, however, be embodied in different forms and should not be construed as limited to an embodiment set forth herein. The present embodiments are provided so that this disclosure will be thorough and complete, and will fully convey the scope of the present disclosure to those skilled in the art. The present disclosure is defined by scopes of claims and their equivalents.

The terms used herein are for the purpose of describing particular embodiments and is not intended to be limiting. As used herein, the singular forms "a" and "an" are intended to include the plural forms as well, unless the context clearly indicates otherwise. It will be further understood that the terms "comprise" and/or "comprising", "include," or "including", and "have" or "having", when used in the present disclosure, specify the presence of stated elements, steps, operations, and/or devices but do not preclude the presence or addition of one or more other elements, steps, operations, and/or devices.

It will be further understood that when an element is referred to as being "connected to" or "coupled with" another element, it can be directly connected or coupled with the other element or intervening elements may be present.

It will be understood that when an element or a layer is referred to as being "connected to" or "coupled with" another element or layer, it can be directly on another element or layer, intervening elements or layers may also be present.

Throughout the specification, the same reference numerals denote the same constituent elements. In the figures, dimensions of the various elements, layers, etc. may be exaggerated for clarity of illustration. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Although the terms "first", "second", and the like are used to describe various constituent elements, these constituent elements are not limited by these terms. These terms are used to distinguish one constituent element from another constituent element. Therefore, a first constituent element described below may be termed the second constituent element within the technical spirit of the present disclosure.

Hereinafter, embodiments of the present disclosure will be described in detail with reference to the accompanying drawings.

Figure 2:
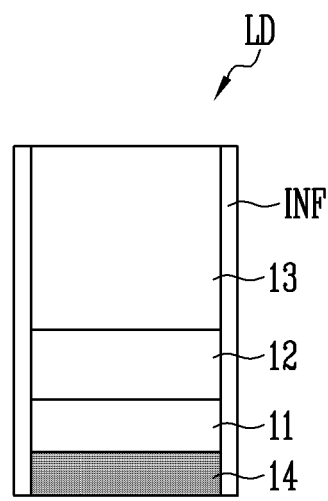

FIGS. 1 and 2 illustrate a perspective view and a cross-sectional view of a light emitting element according to an embodiment, respectively.

Referring to FIGS. 1 and 2, a light emitting element LD may include a first semiconductor layer 11, an active layer 12, a second semiconductor layer 13, a contact electrode 14, and/or an insulation film INF. For example, the light emitting element LD may be configured as a stacked body in which the first semiconductor layer 11, the active layer 12, and the second semiconductor layer 13 are sequentially stacked on each other along one direction (e.g., a length direction of the light emitting element LD).

The light emitting element LD may have a cylindrical shape extending along one direction (e.g., the length direction). The light emitting element LD may have one end portion and the other end portion along the one direction. One of the first and second semiconductor layers 11 and 13 is disposed at one end portion of the light emitting element LD, and the other of the first and second semiconductor layers 11 and 13 is disposed at the other end portion of the light emitting element LD.

The light emitting element LD may be a light emitting element manufactured in a cylindrical shape through an etching method or the like. Throughout the present specification, the "cylindrical shape" includes a rod-like shape and a bar-like shape having an aspect ratio greater than 1, such as a circular cylinder or a polygonal cylinder, but a cross-sectional shape thereof is not particularly limited.

The light emitting element LD may have a size as small as a nanometer scale to a micrometer scale. For example, the light emitting element LD may have a diameter D (or width) and/or a length L ranging from a nanometer scale to a micrometer scale. However, the size of the light emitting element LD is not limited thereto, and the size of the light emitting element LD may be suitably changed according to design conditions of various devices using (or incorporating) the light emitting device LD as a light source, for example, a display device.

The first semiconductor layer 11 may be a first conductive semiconductor layer. For example, the first semiconductor layer 11 may include at least one p-type semiconductor material. For example, the first semiconductor layer 11 may include at least one semiconductor material from among InAlGaN, GaN, AlGaN, InGaN, AlN, and InN and may include a p-type semiconductor material doped with a first conductive dopant, such as Mg. However, the material included in the first semiconductor layer 11 is not limited thereto, and the first semiconductor layer 11 may be made of (or may include) various suitable materials.

The active layer 12 may be disposed between the first semiconductor layer 11 and the second semiconductor layer 13. The active layer 12 may have a single-quantum or multi-quantum well structure. A position of the active layer 12 may be variously changed according to a type of the light emitting element LD. A clad layer doped with a conductive dopant may be formed at an upper portion and/or a lower portion of the active layer 12. For example, the cladding layer may be formed of (or may include) AlGaN or InAlGaN. In some embodiments, a material, such as AlGaN and InAlGaN, may be used to form the active layer 12, but various other suitable materials may form the active layer 12.

When a voltage of a threshold voltage or more is applied to respective ends of the light emitting element LD, the light emitting device LD may emit light while electron-hole pairs are combined in the active layer 12. By controlling the light emission of the light emitting element LD by using this principle, the light emitting element LD may be used as a light source for various light emitting devices, including in pixels of a display device.

The second semiconductor layer 13 is disposed to on the active layer 12 and may include a semiconductor layer of a type different from that of the first semiconductor layer 11. For example, the second semiconductor layer 13 may include at least one n-type semiconductor material. For example, the second semiconductor layer 13 may include a semiconductor material from among InAlGaN, GaN, AlGaN, InGaN, AlN, and InN, and may include a n-type semiconductor layer doped with a second conductive dopant, such as Si, Ge, Sn, or the like but is not necessarily limited thereto. In some embodiments, the length of the second semiconductor layer 13 may be longer than that of the first semiconductor layer 11.

The contact electrode 14 may be disposed on one end portion and/or the other end portion of the light emitting element LD. FIG. 2 illustrates an embodiment in which the contact electrode 14 is formed on the first semiconductor layer 11, but the present disclosure is not necessarily limited thereto. For example, a separate contact electrode may be further disposed on the second semiconductor layer 13.

The contact electrode 14 may include a transparent metal or transparent metal oxide. As an example, the contact electrode 14 may include at least one of an indium tin oxide (ITO), an indium zinc oxide (IZO), a zinc oxide (e.g., the ZnO), and a zinc tin oxide (e.g., the ZTO), but it is not limited thereto. As such, when the contact electrode 14 is made of (or includes) the transparent metal or transparent metal oxide, light generated in the active layer 12 of the light emitting element LD may transmit through the contact electrode 14 to be emitted to the outside of the light emitting element LD.

The insulation film INF may be formed on a surface of the light emitting element LD to surround (e.g., to extend around a periphery of) the first semiconductor layer 11, the active layer 12, the second semiconductor layer 13, and/or the contact electrode 14. The insulation film INF may at least surround the outer circumferential surface of the active layer 12.

The insulation film INF may expose one end portion and the other end portion of the light emitting element LD. For example, the insulation film INF may expose one end of the second semiconductor layer 13 of the light emitting element LD and one end of the contact electrode 14. In another embodiment, the insulation film INF may expose a side portion of the contact electrode 14 adjacent to one end of the second semiconductor layer 13 and/or a side portion of the contact electrode 14 adjacent to one end of the contact electrode 14.

The insulation film INF may be a single layer or a multilayer structure, for example, a double layer structure made of an aluminum oxide (AlOx) and a silicon oxide (SiOx), by including at least one insulation material of a silicon oxide (SiOx), a silicon nitride (SiNx), a silicon oxynitride (SiOxNy), an aluminum oxide (AlOx), and a titanium oxide (TiOx). But the insulation film INF is not limited thereto. In some embodiments, the insulation film INF may be omitted.

When the insulation film INF is provided to cover the surface of the light emitting element LD, such as the outer circumferential surface of the active layer 12, electrical stability of the light emitting element LD may be secured. In addition, when the insulation film INF is provided on the surface of the light emitting element LD, it is possible to improve life-span and efficiency of the light emitting element LD by reducing or minimizing surface defects of the light emitting element LD. In addition, it is possible to prevent or substantially mitigate an unwanted short circuit between the light emitting elements LD from occurring even when a plurality of light emitting elements LD are disposed in close proximity or close contact with each other.

A light emitting device including the light emitting element LD described above may be used in various types of devices that employ a light source, in addition to a display device. For example, a plurality of light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that employ a light source, such as a lighting device.

Figure 3:
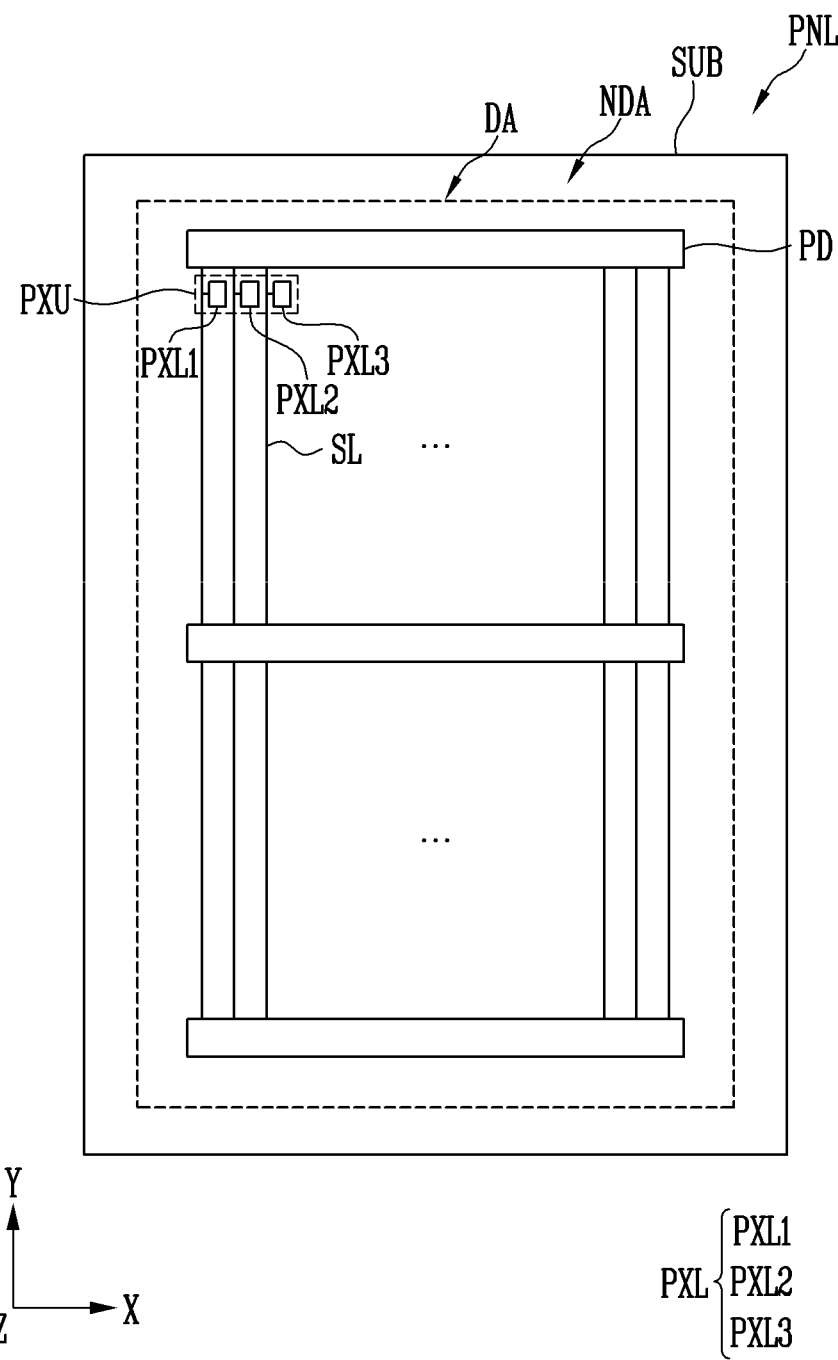
FIG. 3 illustrates a top plan view of a display device according to an embodiment.

FIG. 3 illustrates a top plan view of a display device according to an embodiment.

FIG. 3 illustrates a display panel PNL provided in the display device as an example of an electronic device that may use (e.g., may include) the light emitting element LD described in an embodiment shown in FIGS. 1 and 2 as a light source.

Each pixel unit PXU of the display panel PNL and each pixel configuring the same may include at least one light emitting element LD. For convenience, FIG. 3 schematically illustrates a structure of the display panel PNL based on a display area DA. However, in some embodiments, at least one driving circuit portion (e.g., at least one of a scan driver and a data driver), wires, and/or pads may be further disposed in the display panel PNL.

Referring to FIG. 3, the display panel PNL may include a substrate SUB and the pixel unit PXU disposed on the substrate SUB. The pixel unit PXU may include first pixels PXL1, second pixels PXL2, and/or third pixels PXL3. Hereinafter, when arbitrarily referring to one or more pixels from among the first pixels PXL1, the second pixels PXL2, and the third pixels PXL3, or when comprehensively referring to two or more different pixels, they will be referred to as a "pixel PXL" or "pixels PXL".

The substrate SUB is a base member of the display panel PNL and may include (or be made of) a flexible material that is bendable, foldable, rollable, and the like. For example, the substrate SUB may include at least one of polyimide (PI), polyethersulfone (PES), polyacrylate (PA), polyarylate (PAR), polyetherimide (PEI), polyethylene naphthalate (PEN), polyethylene terephthalate (PET), polyphenylene sulfide (PPS), polyarylate, polycarbonate (PC), cellulose triacetate (CAT), and cellulose acetate propionate (CAP) but is not necessarily limited thereto. In some embodiments, the substrate SUB may be a rigid substrate including (or made of) glass or tempered glass or a flexible substrate (or a thin film) including (or made of) a plastic or metallic material.

According to an embodiment, the substrate SUB may be substantially transparent. In the present disclosure, "substantially transparent" may mean that light may be transmitted at a certain transmittance (e.g., a predetermined transmittance) or more. In another embodiment, the substrate SUB may be translucent or opaque. In some embodiments, the substrate SUB may further include a reflective material.

The display panel PNL and the substrate SUB forming the display panel include a display area DA for displaying an image and a non-display area NDA excluding (or other than) the display area DA.

Pixels PXL, signal lines SL, and/or pad portions PD may be disposed in the display area DA. Various wires connected to the pixels PXL of the display area DA and/or drivers may be disposed in the non-display area NDA. The pixels PXL may be regularly arranged according to a stripe or PenTile® (a registered Trademark of Samsung Display Co., Ltd.) (e.g., an RGBG matrix) arrangement structure. However, the arrangement structure of the pixels PXL is not limited thereto, and the pixels PXL may be arranged in the display area DA in various suitable structures and/or methods.

In some embodiments, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one first to third pixels PXL1, PXL2, and PXL3 disposed adjacent to each other may form one pixel unit PXU (e.g., one pixel unit PXU may include one each first to third pixels PXL1, PXL2, and PXL3 arranged adjacent to each other) that may emit light of various colors. For example, each of the first to third pixels PXL1, PXL2, and PXL3 may be a sub-pixel emitting light of a certain color. In some embodiments, the first pixel PXL1 may be a red pixel that emits red light, the second pixel PXL2 may be a green pixel that emits green light, and the third pixel PXL3 may be a blue pixel that emits blue light, but the present disclosure is not limited thereto.

In an embodiment, the first to third pixels PXL1, PXL2, and PXL3 are provided with a first color light emitting element, a second color light emitting element, and a third color light emitting element as a light source, respectively, so that they respectively emit light of the first color, second color, and third color. In another embodiment, the first to third pixels PXL1, PXL2, and PXL3 are provided with light emitting elements of the same color and include color conversion layers and/or color filters of different colors disposed on respective light emitting elements so that they may emit light of the first color, the second color, and the third color, respectively. However, the color, type, and/or number of pixels PXL configuring each pixel unit PXU are not particularly limited. That is, the color of light emitted by each pixel PXL may be variously changed.

The pixel PXL may include at least one light source driven by a control signal (e.g., a scan signal and a data signal) provided through the signal lines SL and/or a power source (e.g., a first power source and a second power source). In an embodiment, the light source may include at least one light emitting device LD according to the embodiment shown in FIGS. 1 and 2, for example, an ultra-small cylindrical shape light emitting element LD having a size as small as nanometer scale to micrometer scale. However, the present disclosure is not limited thereto, and various types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device having various suitable structures and/or driving methods.

The signal lines SL may be spaced apart from each other at an interval (e.g., a regular or predetermined internal) in a first direction (e.g., the X-axis direction) within the display area DA and may extend along a second direction (e.g., the Y-axis direction). The signal lines SL may be electrically connected to the pad portion PD to provide a driving signal outputted from a driver to each pixel PXL.

The pad portion PD may be disposed in the display area DA. For example, pad portions PD may be spaced apart from each other by an interval (e.g., a regular or predetermined internal) in the second direction (e.g., the Y-axis direction) within the display area DA and disposed along the first direction (e.g., the X-axis direction). However, the present disclosure is not necessarily limited thereto, and the pad portions PD may be spaced apart from each other by an interval in the first direction (e.g., the X-axis direction) and disposed along the second direction (e.g., the Y-axis direction). In such an embodiment, the signal lines SL may be spaced apart from each other by an interval (e.g., a regular or predetermined internal) in the second direction (e.g., the Y-axis direction) according to the disposition of the pad portion DP to extend along the first direction (e.g., the X-axis direction). The disposition of the pad portion(s) PD and the signal lines SL may, however, be variously changed. When the pad portion PD is disposed in the display area DA as described above, an additional space for disposing the pad portion PD at a lower end portion of the non-display area NDA may be unnecessary. Therefore, it is possible to reduce or minimize the non-display area NDA of the display device, that is, a dead space.

Figure 4:
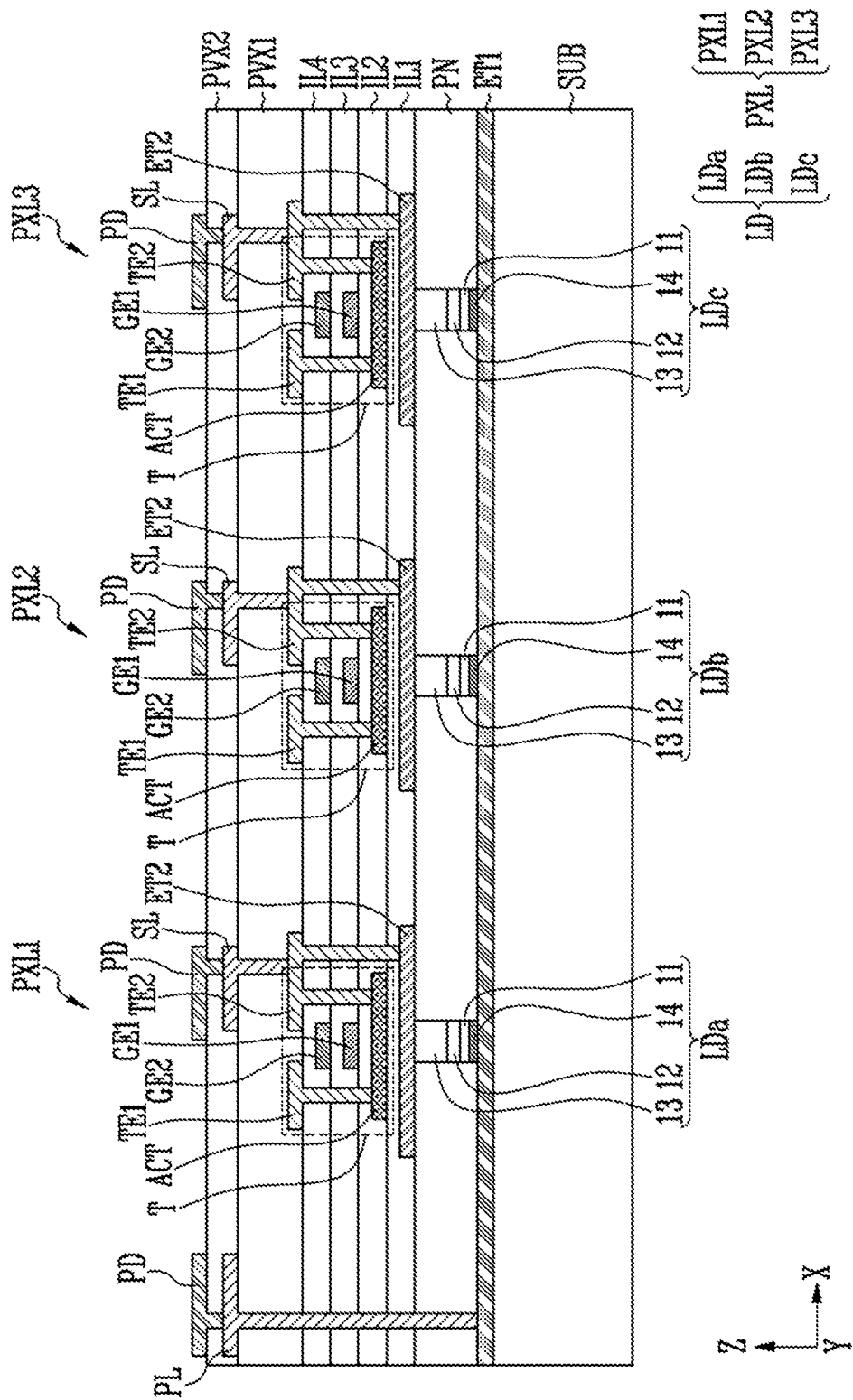
FIG. 4 illustrates a cross-sectional view of a display device according to an embodiment.
Figure 5:
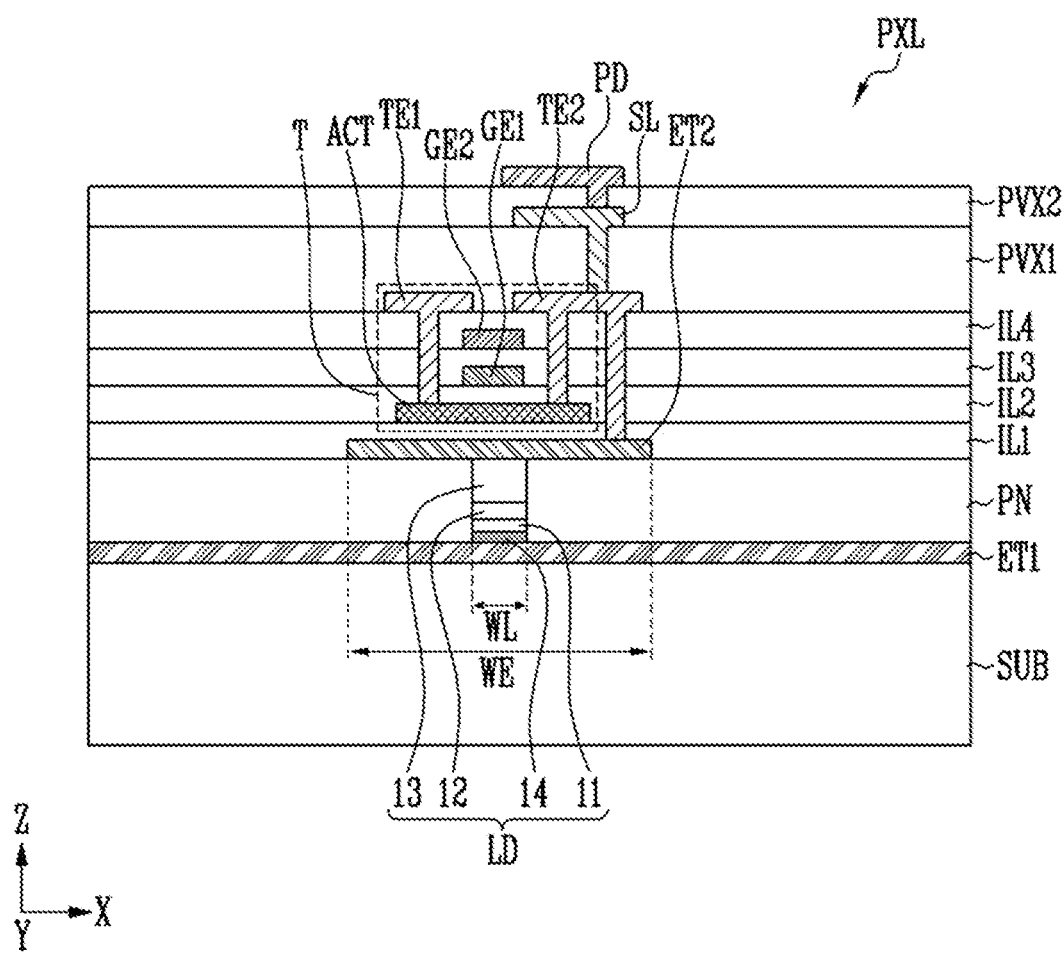
FIG. 5 illustrates a cross-sectional view of a pixel according to an embodiment.

FIG. 4 illustrates a cross-sectional view of a display device according to an embodiment. FIG. 5 illustrates a cross-sectional view of a pixel according to an embodiment.

FIG. 4 illustrates a cross-section of a display device, for example, a display panel PNL provided in the display device, based on an area in which one pixel unit PXU including the first pixel PXL1, the second pixel PXL2, and the third pixel PXL3 adjacent to each other is disposed.

FIG. 5 schematically illustrates one transistor T connected to the light emitting element LD for better understanding and ease of description, but the display device may include a plurality of light emitting elements LD disposed in each pixel PXL and a plurality of transistors T for driving the plurality of light emitting elements LD. In addition, in some embodiments, each pixel PXL may further include a storage capacitor and/or a power line.

Referring to FIGS. 4 and 5, each pixel PXL of the display device may include at least one light emitting element LD, at least one transistor T, the signal line SL, and the pad portion PD on the substrate SUB. In an embodiment, the substrate SUB may correspond to a front surface of the display panel PNL, and the pad portion PD may correspond to a rear surface of the display panel PNL. That is, light emitted from the light emitting elements LD may be emitted in the opposite direction of a third direction (e.g., the Z-axis direction) through the substrate SUB.

A first electrode ET1 may be disposed on one surface of the substrate SUB. The first electrode ET1 may be disposed on a front surface of the substrate SUB. The first electrode ET1 is a transparent electrode and may include a transparent metal or a transparent metal oxide. The first electrode ET1 may include the same material as the contact electrode 14 of the light emitting element LD, described above. As an example, the first electrode ET1 may include at least one of an indium tin oxide (ITO), an indium zinc oxide (IZO), a zinc oxide (e.g., the ZnO), and a zinc tin oxide (e.g., the ZTO) but is not limited thereto. As described above, when the first electrode ET1 is a transparent electrode, the light generated by the light emitting element LD may pass through the first electrode ET1 to be emitted to the other surface of the substrate SUB, which is an emission direction of each pixel PXL (e.g., the opposite direction of the third direction (e.g., the Z-axis direction)).

A second electrode ET2 may be disposed on the first electrode ET1. The second electrode ET2 is a reflective electrode and may include (or may be made of) an opaque metal or a conductive material with uniform or substantially uniform reflectivity. For example, the second electrode ET2 may include at least one of a metal, such as aluminum (Al), magnesium (Mg), silver (Ag), molybdenum (Mo), platinum (Pt), palladium (Pd), gold (Au), nickel (Ni), neodymium (Nd), iridium (Ir), chromium (Cr), and an alloy thereof but is not limited thereto. When the second electrode ET2 is a reflective electrode, even if the light emitted from the light emitting element LD proceeds inside the display panel PNL, it may be reflected by the second electrode ET2 to be emitted in the emission direction of each pixel PXL (e.g., in the opposite direction of the third direction (e.g., the Z-axis direction)). Thus, light emission efficiency may be improved by reducing or minimizing light loss.

The light emitting element LD may be disposed between the first electrode ET1 and the second electrode ET2. The light emitting element LD may be mounted in each pixel PXL to be used as a light source of a display device. In an embodiment, the light emitting element LD may include at least one light emitting element LD according to the embodiment shown in FIGS. 1 and 2, for example, an ultra-small cylindrical shape light emitting element LD having a size as small as nanometer scale to micrometer scale. For example, the light emitting element LD may be a micro light emitting diode having a size of a micrometer unit. For example, a length of one side of the light emitting element LD may be about 100 μm or less but is not limited thereto, and the structure and size of the light emitting element LD may be variously changed according to design conditions of various devices using the light emitting element LD as a light source, for example, display devices.

The light emitting element LD may be disposed to overlap the second electrode ET2 in the third direction (e.g., the Z-axis direction). The light emitting element LD may be covered by the second electrode ET2. In such an embodiment, a width WE of the second electrode ET2 in the first direction (e.g., the X-axis direction) may be larger than a width WL of the light emitting element LD of the first direction (e.g., the X-axis direction). As such, when the second electrode ET2, which is a reflective electrode, covers the light emitting element LD, the light emitted from the light emitting element LD may be more effectively reflected by the second electrode ET2, thereby improving the light emission efficiency of the display device.

The first semiconductor layer 11 of the light emitting element LD may be electrically connected to the first electrode ET1, and the second semiconductor layer 13 of the light emitting element LD may be electrically connected to the second electrode ET2. In addition, the contact electrode 14 may be disposed between the first electrode ET1 and the first semiconductor layer 11 of the light emitting element LD. In an embodiment, the contact electrode 14 may be directly disposed on (e.g., may directly contact) the first electrode ET1. When the light emitting element LD is directly bonded to the first electrode ET1, material selection limitations may be reduced due to a process temperature compared to ACF bonding, NCF bonding, and eutectic bonding. In addition, because there is no step under the light emitting element LD, a contact failure of the light emitting element LD may be mitigated or prevented.

In an embodiment, the first to third pixels PXL1, PXL2, and PXL3 may include the light emitting elements LD that emit light of different colors. For example, the first pixel PXL1 may include a first light emitting element LDa that emits a first color, the second pixel PXL2 may include a second light emitting element LDb that emits a second color, and the third pixel PXL3 may include a third light emitting element LDc that emits a third color. In some embodiments, the first light emitting element LDa, the second light emitting element LDb, and the third light emitting element LDc may be a red light emitting element, a green light emitting element, and a blue light emitting element, respectively, but the present disclosure is not limited thereto.

The light emitting element LD may be electrically connected to a circuit element, such as a plurality of transistors T, via the first and second electrodes ET1 and ET2 to emit light based on (or according to) a control signal (e.g., a scan signal and data signal) and/or a power source. For example, when a voltage of a threshold voltage or more is applied to respective ends of the light emitting element LD, the light emitting device LD emits light while electron-hole pairs are combined in the active layer 12 of the light emitting element LD. By controlling the light emission of the light emitting element LD according to this principle, the light emitting element LD may be used as a light source of a display device.

FIGS. 4 and 5 illustrate an embodiment in which the first semiconductor layer 11 is electrically connected to the first electrode ET1 and the second semiconductor layer 13 is electrically connected to the second electrode ET2, but the present disclosure is not necessarily limited thereto. For example, in some embodiments, the light emitting element LD may be disposed so that the first semiconductor layer 11 is electrically connected to the second electrode ET2, and the second semiconductor layer 13 is electrically connected to the first electrode ET1. In addition, because the first semiconductor layer 11, the active layer 12, and the second semiconductor layer 13 of the light emitting element LD have already been described above with reference to FIGS. 1 and 2, redundant descriptions thereof are omitted.

In some embodiments, the display device may further include a planarization layer PN surrounding (e.g., extending around a periphery of) the light emitting element LD between the first electrode ET1 and the second electrode ET2. The planarization layer PN may directly cover a side surface of the light emitting element LD to contact the light emitting element LD. One surface of the planarization layer PN may be in contact with the first electrode ET1, and the other surface of the planarization layer PN may be in contact with the second electrode ET2. For example, the planarization layer PN may be directly disposed on the first electrode ET1, and the second electrode ET2 may be directly disposed on the planarization layer PN.

In an embodiment, the planarization layer PN may include an organic insulation material. For example, the planarization layer PN may include at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB). However, the planarization layer PN is not necessarily limited thereto, and the planarization layer PN may further include various suitable types of inorganic insulation materials including a silicon nitride ($SiN_x$), a silicon oxide ($SiO_x$), a silicon oxynitride ($SiO_xN_y$), or an aluminum oxide ($AlO_x$).

A first insulation layer IL1 may be disposed on the second electrode ET2. The first insulation layer IL1 may be disposed on the front surface of the substrate SUB. The first insulation layer IL1 may be a single layer or a multilayer structure and may include at least one inorganic insulation material and/or organic insulation material. For example, the first insulation layer IL1 may include a silicon nitride ($SiN_x$), a silicon oxide ($SiO_x$), a silicon oxynitride ($SiO_xN_y$), or an aluminum oxide ($AlO_x$), and various suitable types of organic/inorganic insulation materials.

At least one transistor T may be disposed on the second electrode ET2 and the first insulation layer IL1. As described above, when the transistor T is formed after fixing the light emitting element LD on the first electrode ET1, it is possible to prevent or substantially prevent the transistor T from being damaged during a bonding process of the light emitting element LD.

The transistor T may be disposed on the second electrode ET2 to overlap the light emitting element LD in the third direction (e.g., the Z-axis direction). As described above, when the transistor T is disposed to overlap the light emitting element (LD), an area occupied by the transistor T within each pixel PXL may be reduced or minimized so that a high resolution display device may be more easily implemented.

Each transistor T may include a semiconductor layer ACT, gate electrodes GE1 and GE2, and transistor electrodes TE1 and TE2. FIGS. 4 and 5 illustrate an embodiment in which each transistor T includes the first and second transistor electrodes TE1 and TE2 formed separately from the semiconductor layer ACT, but the present disclosure is not necessarily limited thereto. For example, in another embodiment, the first and/or second transistor electrodes TE1 and/or TE2 provided in at least one transistor T may be integrated with the semiconductor layer ACT.

The semiconductor layer ACT may be disposed on the first insulation layer IL1. The semiconductor layer ACT may include a first area contacting the first transistor electrode TE1, a second area contacting the second transistor electrode TE2, and a channel area disposed between the first and second areas. In some embodiments, one of the first and second areas may be a source area, and the other thereof may be a drain area.

In some embodiments, the semiconductor layer ACT may be a semiconductor pattern including (or made of) polysilicon, amorphous silicon, an oxide semiconductor, or the like. In addition, the channel area of the semiconductor layer ACT may be an intrinsic semiconductor as a semiconductor pattern that is not doped with impurities, and each of the first and second areas of the semiconductor layer ACT may be a semiconductor pattern doped with impurities.

A second insulation layer IL2 may be disposed on the semiconductor layer ACT. The second insulation layer IL2 may be disposed on the front surface of the substrate SUB. The second insulation layer IL2 may be a single layer or a multilayer structure and may include at least one inorganic insulation material and/or organic insulation material. For example, the second insulation layer IL2 may include a silicon nitride ($SiN_x$), a silicon oxide ($SiO_x$), a silicon oxynitride ($SiO_xN_y$), or an aluminum oxide ($AlO_x$), and various suitable types of organic/inorganic insulation materials.

The first gate electrode GE1 may be disposed on the second insulation layer IL2. The first gate electrode GE1 may be disposed on the second insulation layer IL2 to overlap the semiconductor layer ACT. The first gate electrode GE1 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu) but is not necessarily limited thereto.

A third insulation layer IL3 may be disposed on the first electrode GE1. The third insulation layer IL3 may be disposed on the front surface of the substrate SUB. The third insulation layer IL3 may be a single layer or a multilayer structure and may include at least one inorganic insulation material and/or organic insulation material. For example, the third insulation layer IL3 may include a silicon nitride ($SiN_x$), a silicon oxide ($SiO_x$), a silicon oxynitride ($SiO_xN_y$), or an aluminum oxide ($AlO_x$), and various suitable types of organic/inorganic insulation materials.

The second gate electrode GE2 may be disposed on the third insulation layer IL3. The second gate electrode GE2 may be disposed on the third insulation layer IL3 to overlap the first gate electrode GE1. The second gate electrode GE2 may include the same material as the first gate electrode GE1. For example, the second gate electrode GE2 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu) but is not necessarily limited thereto.

A fourth insulation layer IL4 may be disposed on the second electrode GE2. The fourth insulation layer IL4 may be disposed on the front surface of the substrate SUB. The fourth insulation layer IL4 may be a single layer or a multilayer structure and may include at least one inorganic insulation material and/or organic insulation material. For example, the fourth insulation layer IL4 may include a silicon nitride ($SiN_x$), a silicon oxide ($SiO_x$), a silicon oxynitride ($SiO_xN_y$), or an aluminum oxide ($AlO_x$), and various suitable types of organic/inorganic insulation materials.

The first and second transistor electrodes TE1 and TE2 may be disposed on the fourth insulation layer IL4. The first and second transistor electrodes TE1 and TE2 may be electrically connected to the semiconductor layer ACT. For example, the first transistor electrode TE1 may be electrically connected to the first area of the semiconductor layer ACT through a contact opening (e.g. a contact hole) penetrating through the second to fourth insulation layers IL2, IL3, and IL4. The second transistor electrode TE2 may be electrically connected to the second area of the semiconductor layer ACT through the contact opening penetrating through the second to fourth insulation layers IL2, IL3, and IL4. In addition, the second transistor electrode TE2 may be electrically connected to the second electrode ET2 through another contact opening (e.g., another contact hole) penetrating the first to fourth insulation layers IL1, IL2, IL3, and IL4. In some embodiments, one of the first and second transistor electrodes TE1 and TE2 may be a source electrode, and the other thereof may be a drain electrode.

A first passivation layer PVX1 may be disposed on the first and second transistor electrodes TE1 and TE2. The first passivation layer PVX1 may include an organic insulation material. For example, the first passivation layer PVX1 may include at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB) but is not necessarily limited thereto. For example, the first passivation layer PVX1 may further include a silicon nitride ($SiN_x$), a silicon oxide ($SiO_x$), a silicon oxynitride ($SiO_xN_y$), or an aluminum oxide ($AlO_x$), and various suitable types of inorganic insulation materials.

A signal line SL and/or a power line PL may be disposed on the first passivation layer PVX1. The signal line SL may be disposed to overlap each pixel PXL. In such an embodiment, the signal line SL may be disposed to overlap the second electrode ET2, which is a reflective electrode, in the third direction (e.g., the Z-axis direction). The signal line SL may be electrically connected to the pad portion PD to provide a driving signal outputted from a driver to each pixel PXL. For example, the signal line SL may be electrically connected to the second transistor electrode TE2 through a contact opening (e.g., a contact hole) passing through the first passivation layer PVX1 but is not limited thereto. In another embodiment, the signal line SL may be electrically connected to the first transistor electrode TE1 and/or the first electrode ET1.

The power line PL may be formed in the same conductive layer as the signal line SL. The power line PL may be electrically connected to the first electrode ET1 through a contact opening (e.g., a contact hole) penetrating through the first passivation layer PVX1 and the insulation layers IL1, IL2, IL3, and IL4 and the planarization layer PN disposed under the first passivation layer PVX1. However, it is not necessarily limited thereto, and the power line PL may be electrically connected to the first electrode ET1 through a separate bridge electrode.

A second passivation layer PVX2 may be disposed on the signal line SL and/or the power line PL. The second passivation layer PVX2 may include an organic insulation material. For example, the second passivation layer PVX2 may include at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB) but is not necessarily limited thereto. For example, the second passivation layer PVX2 may further include a silicon nitride ($SiN_x$), a silicon oxide ($SiO_x$), a silicon oxynitride ($SiO_xN_y$), or an aluminum oxide ($AlO_x$), and various suitable types of inorganic insulation materials.

The pad portion PD may be disposed on the second passivation layer PVX2. The pad portion PD may be disposed to overlap each pixel PXL. In such an embodiment, the pad portion PD may be disposed to overlap the second electrode ET2, which is a reflective electrode, in the third direction (e.g., the Z-axis direction). As described above, when the pad portion PD is disposed in the light emitting area of the pixel PXL, because an additional space for disposing the pad portion PD is unnecessary, the dead space of the display device may be reduced or minimized. Each of the pad portions PD may be electrically connected to the signal line SL or the power line PL through a contact opening (e.g., a contact hole) passing through the second passivation layer PVX2.

According to the display device according to an embodiment described above, the element reliability may be improved by forming the transistor T after directly bonding the light emitting element LD onto the flat first electrode ET1. In addition, by forming the second electrode ET2, which is a reflective electrode, on the light emitting element LD, it is possible to improve the light emission efficiency, and by disposing the transistor T to overlap the light emitting element LD, it is possible to more easily realize the high resolution display device.

Hereinafter, another embodiment will be described. The same elements as those described above will be referred to with the same reference numerals in embodiments below, and redundant descriptions thereof may be omitted or simplified.

Figure 6:
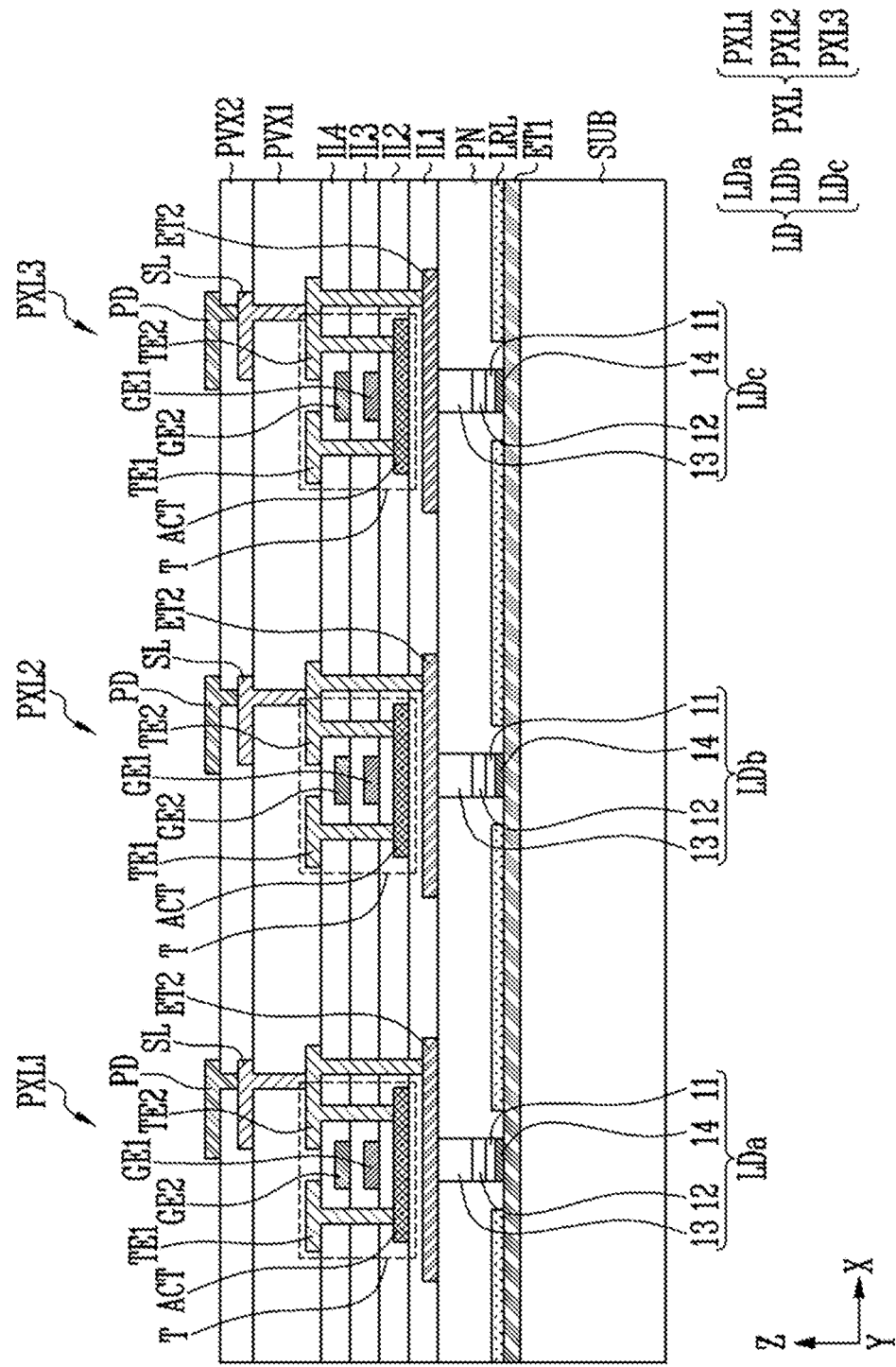
FIG. 6 illustrates a cross-sectional view of a display device according to an embodiment.

FIG. 6 illustrates a cross-sectional view of a display device according to another embodiment.

Referring to FIG. 6, the display device according to the present embodiment is different from the embodiment shown in FIGS. 4 and 5 in that it further includes a low-resistance conductive layer LRL.

For example, the low-resistance conductive layer LRL may be disposed on the first electrode ET1. The low-resistance conductive layer LRL may be directly disposed on one surface of the first electrode ET1 to contact the first electrode ET1.

The low-resistance conductive layer LRL is has relatively low resistance compared to the first electrode ET1 and may be electrically connected to the first electrode ET1 to reduce or minimize a voltage drop due to a signal delay (e.g., RC delay).

The low-resistance conductive layer LRL may include at least one of molybdenum (Mo), silver (Ag), titanium (Ti), copper (Cu), chromium (Cr), nickel (Ni), and aluminum (Al) but is not necessarily limited thereto. In some embodiments, to prevent or reduce transmittance degradation of the display device, the low-resistance conductive layer LRL may have a mesh shape. However, the material and shape of the low-resistance conductive layer LRL may be variously changed.

The low-resistance conductive layer LRL may be disposed at a boundary of (e.g., between adjacent ones of) the pixels PXL. For example, the low-resistance conductive layer LRL may be disposed at a boundary between the first to third pixels PXL to be disposed between the first to third light emitting elements LDa, LDb, and LDc. For example, the low-resistance conductive layer LRL may be disposed so as to not overlap the light emitting element LD. The low-resistance conductive layer LRL includes an opening exposing the first electrode ET1, and the light emitting element LD may be disposed in the opening of the low-resistance conductive layer LRL. Accordingly, the contact electrode 14 of the light emitting element LD may be directly bonded to the first electrode ET1. As described above, the element reliability may be improved by forming the transistor T after directly bonding the light emitting element LD onto the first electrode ET1.

Figure 7:
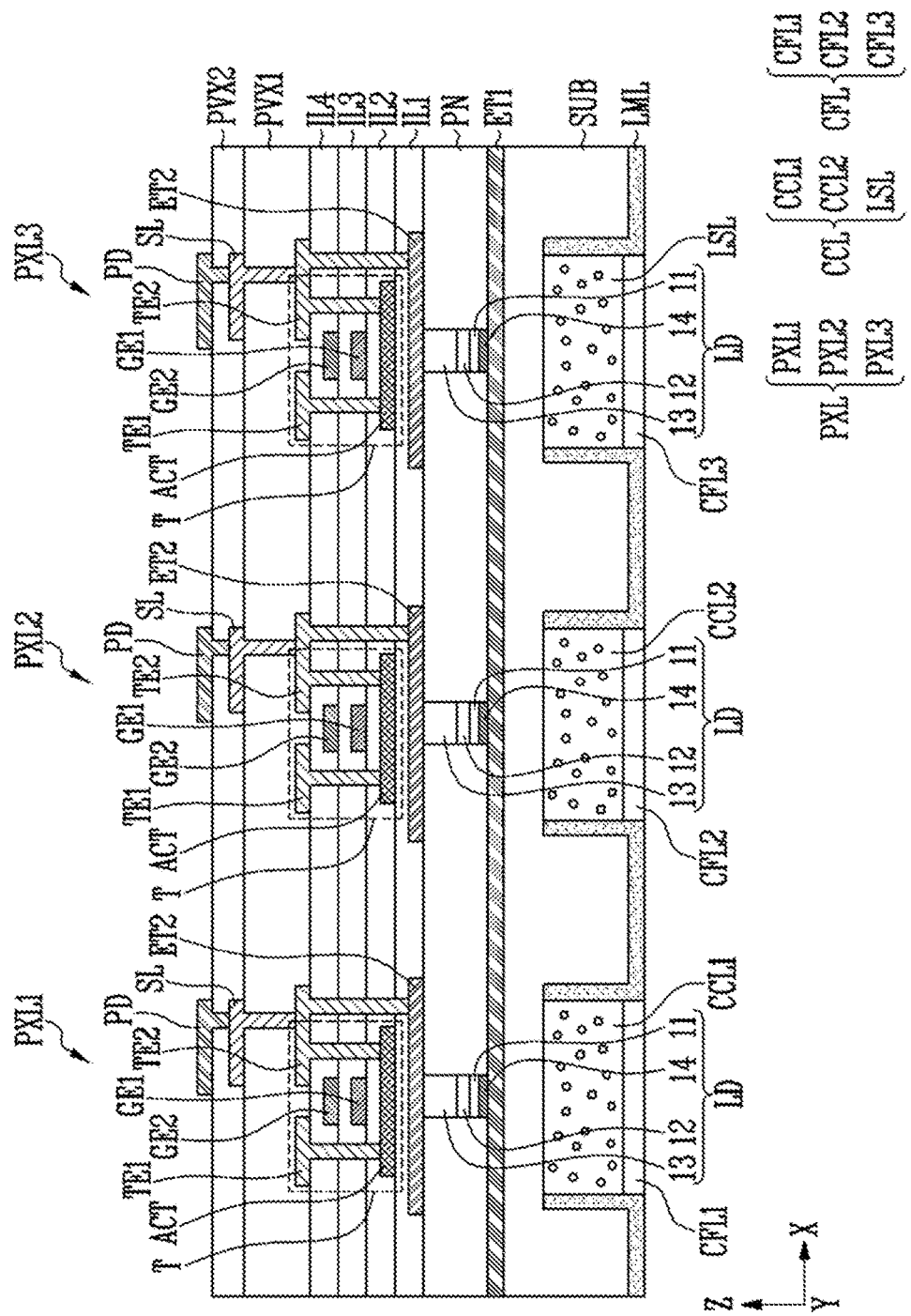
FIG. 7 illustrates a cross-sectional view of a display device according to an embodiment.

FIG. 7 illustrates a cross-sectional view of a display device according to another embodiment.

Referring to FIG. 7, the display device according to the present embodiment is different from the embodiment shown in FIGS. 4 and 5 in that it further includes a color conversion layer CCL and/or a color filter layer CFL.

For example, the color conversion layer CCL may be disposed on the other surface of the substrate SUB. The color conversion layer CCL may be disposed to overlap the light emitting element LD disposed on one surface of the substrate SUB in the third direction (e.g., the Z-axis direction). In an embodiment, the other surface of the substrate SUB includes a depression (e.g., a groove), and the color conversion layer CCL may be disposed in the depression in the substrate SUB. The depression in the substrate SUB may overlap the light emitting element LD in the third direction (e.g., the Z-axis direction). However, the present disclosure is not necessarily limited thereto, and in an embodiment, the substrate SUB may be flatly formed, and the color conversion layer CCL may be formed on the other surface of the substrate SUB.

The color conversion layer CCL may include a base resin with color conversion particles and/or light scattering particles dispersed in the base resin.

The color conversion layer CCL may include a first color conversion layer CCL1 disposed on the first pixel PXL1, a second color conversion layer CCL2 disposed on the second pixel PXL2, and a light scattering layer LSL disposed on the third pixel PXL3.

In an embodiment, the first to third pixels PXL1, PXL2, and PXL3 may include the light emitting elements LD that emit light of the same color. For example, the first to third pixels PXL1, PXL2, and PXL3 may include the light emitting elements LD that emit light of a third color, for example, a blue color. The color conversion layer CCL including color conversion particles is disposed on at least some of the pixels PXL from among the first to third pixels PXL1, PXL2, and PXL3, thereby displaying a full-color image. However, the present disclosure is not necessarily limited thereto, the first to third pixels PXL1, PXL2, and PXL3 may include light emitting elements LD that emit light of different colors.

The first color conversion layer CCL1 may include first color conversion particles that convert light of the third color emitted from the light emitting element LD into light of the first color. For example, when the light emitting element LD is a blue light emitting element that emits blue light and the first pixel PXL1 is a red pixel, the first color conversion layer CCL1 may include a first quantum dot that converts blue light emitted from the blue light emitting element into red light. For example, the first color conversion layer CCL1 may include a plurality of first quantum dots dispersed in a matrix material, such as a base resin. The first quantum dot may absorb blue light to shift a wavelength according to an energy transition to emit red light. When the first pixel PXL1 is a pixel of a different color, the first color conversion layer CCL1 may include a first quantum dot corresponding to a color of the first pixel PXL1.

The second color conversion layer CCL2 may include second color conversion particles that convert light of the third color emitted from the light emitting element LD into light of the second color. For example, when the light emitting element LD is a blue light emitting element that emits blue light and the second pixel PXL2 is a green pixel, the second color conversion layer CCL2 may include a second quantum dot that converts blue light emitted from the blue light emitting element into green light. For example, the second color conversion layer CCL2 may include a plurality of second quantum dots dispersed in a matrix material, such as a base resin. The second quantum dot may absorb blue light to shift a wavelength according to an energy transition to emit green light. When the second pixel PXL2 is a pixel of a different color, the second color conversion layer CCL2 may include a second quantum dot corresponding to a color of the second pixel PXL2.

The first quantum dot and the second quantum dot may have a spherical, pyramidal, and multi-arm shape, or a cube of a nano particle, a nanotube, a nano wire, a nano fiber, a nano plate-shaped particle, etc. but are not limited thereto, and shapes of the first quantum dot and the second quantum dot may be variously changed.

In an embodiment, blue light having a relatively short wavelength from among visible light is incident on the first quantum dot and the second quantum dot, respectively, thereby increasing an absorption coefficient of the first quantum dot and the second quantum dot. Accordingly, the efficiency of light emitted from the first pixel PXL1 and the second pixel PXL2 may be increased and excellent color reproducibility may be ensured. In this embodiment, the pixel unit PXU of the first to third pixels PXL1, PXL2, and PXL3 is configured by using the light emitting elements LD emitting the same color (e.g., the blue color light emitting elements), thereby increasing the manufacturing efficiency of the display device.

The light scattering layer LSL may be selectively provided to efficiently use the third color light emitted from the light emitting element LD. For example, when the light emitting element LD is a blue light emitting element that emits blue light and the third pixel PXL3 is a blue pixel, the light scattering layer LSL may include at least one type of light scattering particles to efficiently use the light emitted from the light emitting element LD.

For example, the light scattering layer LSL may include a plurality of light scattering particles dispersed in a matrix material, such as a base resin. For example, the light scattering layer LSL may include light scattering particles SCT, such as silica and the like, but materials included in the light scattering particles SCT are not limited thereto. On the other hand, the light scattering particles SCT need not be disposed only in a third pixel area PXA3 in which the third pixel PXL3 is formed. For example, the light scattering particles SCT may be selectively included in the first and/or second color conversion layers CCL1 and CCL2.

The color filter layer CFL may be disposed on the color conversion layer CCL. The color filter layer CFL may include a color filter that matches the color of each pixel PXL.

The color filter layer CFL may include a color filter that matches the color of each pixel PXL. For example, the color filter layer CFL may include a first color filter CFL1 that is disposed in the first pixel PXL1 to selectively transmit light generated by the first pixel PXL1, a second color filter CFL2 that is disposed in the second pixel PXL2 to selectively transmit light generated by the second pixel PXL2, and a third color filter CFL3 that is disposed in the third pixel PXL3 to selectively transmit light generated by the third pixel PXL3. In an embodiment, the first color filter CFL1, the second color filter CFL2, and the third color filter CFL3 may be a red color filter, a green color filter, and a blue color filter respectively, but the present disclosure is not limited thereto. Hereinafter, when referring to one of the first color filter CFL1, the second color filter CFL2, and the third color filter CFL3, or when comprehensively referring to two or more thereof, it will be referred to as the "color filter CF" or "color filters CF".

The first color filter CFL1 is disposed to overlap a light emitting area EMA of the first pixel PXL1 and may include a color filter material that selectively transmits light of the first color. For example, when the first pixel PXL1 is a red pixel, the first color filter CFL1 may include a red color filter material.

The second color filter CFL2 is disposed to overlap the light emitting area EMA of the second pixel PXL2 and may include a color filter material that selectively transmits light of the second color. For example, when the second pixel PXL2 is a green pixel, the second color filter CFL2 may include a green color filter material.

The third color filter CFL3 is disposed to overlap the light emitting area EMA of the third pixel PXL3 and may include a color filter material that selectively transmits light of the third color. For example, when the third pixel PXL3 is a blue pixel, the third color filter CFL3 may include a blue color filter material.

A light blocking pattern LML may be disposed at the boundary of each pixel PXL. The light blocking pattern LML may be disposed to surround (e.g., to extend around a periphery of) the color conversion layer CCL and/or the color filter layer CFL at the boundary of each pixel PXL. The light blocking pattern LML may block internal light scattering or external light reflection. The light blocking pattern LML may be disposed to not overlap the light emitting element LD. For example, the light blocking pattern LML has an opening formed by partially removing it (e.g., by removing a portion thereof), and the color conversion layer CCL and/or the color filter layer CFL that overlap the light emitting element LD may be disposed in the opening. The light blocking pattern LML may include (or may be made of) an organic material including at least one of graphite, carbon black, black pigment, and black dye or may include (or may be made of) a metallic material including chromium (Cr), but the material for forming the light blocking pattern LML is not limited as long as it is a material that may block light transmission and absorb light.

The display device may further include a capping layer covering the color conversion layer CCL. The capping layer may prevent or substantially prevent impurities, such as moisture and/or air, from penetrating from the outside to damage or contaminate the color conversion layer CCL. In addition, the capping layer may prevent a colorant included in the color filter layer CFL from spreading to other constituent elements. The capping layer, as an inorganic layer, may include at least one of a silicon nitride ($SiN_x$), an aluminum nitride ($AlN_x$), a titanium nitride ($TiN_y$), a silicon oxide ($SiO_x$), an aluminum oxide ($AlO_x$), a titanium oxide ($TiO_x$), and a silicon oxynitride ($SiO_xN_y$) but is not necessarily limited thereto.

In addition, the display device may further include a low refractive layer disposed on the color conversion layer CCL. The low refractive layer may improve light efficiency of the display panel PNL by recycling light provided from the color conversion layer CCL by total reflection. For example, the low refractive layer may have a relatively low refractive index compared to that of the color conversion layer CCL. For example, a refractive index of the low refractive layer may be in a range from about 1.1 to 1.3 but is not limited thereto.

A manufacturing method of the display device according to the above-described embodiment will now be described.

FIGS. 8 to 13 illustrate cross-sectional views of steps of a manufacturing method of a display device according to an embodiment. FIGS. 8 to 13 are cross-sectional views for explaining the manufacturing method of the display device shown in FIG. 5, and constituent elements that are substantially the same as those shown in FIG. 5 are denoted by the same reference numerals and detailed descriptions thereof may be omitted.

Referring to FIG. 8, first, the first electrode ET1 is formed on one surface of the substrate SUB. The first electrode ET1 may be formed on the front surface of the substrate SUB by using a transparent metal or transparent metal oxide. As an example, the first electrode ET1 may be formed by using a transparent metallic material including at least one of an indium tin oxide (ITO), an indium zinc oxide (IZO), a zinc oxide (e.g., ZnO), and a zinc tin oxide (e.g., ZTO) but is not limited thereto.

Referring to FIG. 9, the light emitting element LD is then fixed on the first electrode ET1. A transfer substrate TS including at least one light emitting element LD is disposed to be adjacent to the substrate SUB on which the first electrode ET1 is formed so that the light emitting element LD may contact the first electrode ET1. Accordingly, the contact electrode 14 of the light emitting element LD may be directly bonded to the first electrode ET1. In an embodiment, the light emitting element LD may be formed on a separate base substrate and then separated from the base substrate to be transferred to the transfer substrate TS. The base substrate may include a sapphire substrate and a transparent substrate, such as glass. However, it is not necessarily limited thereto, and the base substrate may be formed as a conductive substrate, such as GaN, SiC, ZnO, Si, GaP, and GaAs. The transfer substrate TS may include (or may be made of) a stretchable material according to embodiments and may further include an adhesive layer for attaching the light emitting element LD.

Referring to FIG. 10, the transfer substrate TS is then separated from the light emitting element LD. For example, when adherence between the transfer substrate TS and the light emitting element LD is less than adherence between the first electrode ET1 and the light emitting element LD, the transfer substrate TS may be easily separated from the light emitting element LD. As described above, when the light emitting element LD is directly bonded onto the first electrode ET1, this material selection limitations may be reduced due to a process temperature compared to ACF bonding, NCF bonding, or eutectic bonding.

Figure 11:
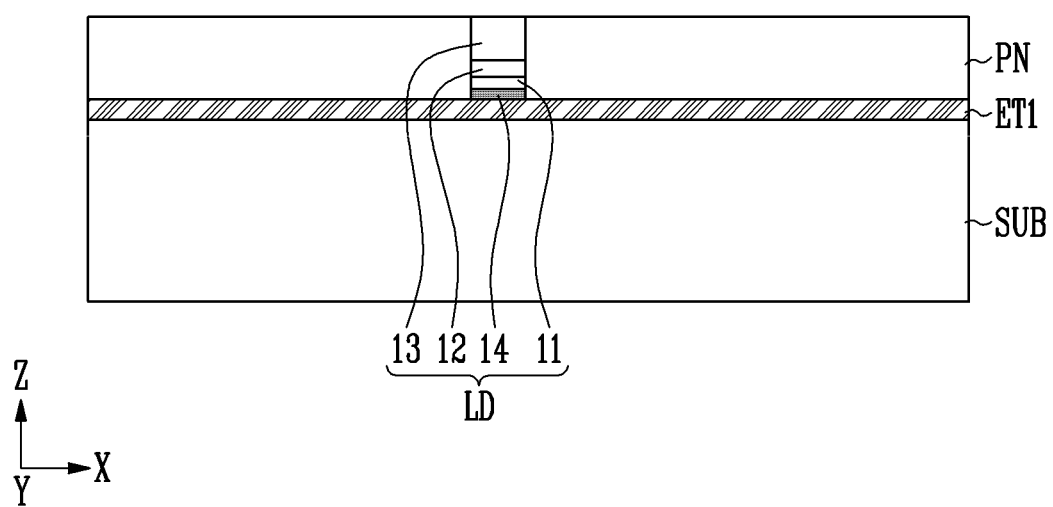

Referring to FIG. 11, the planarization layer PN is then formed on the first electrode ET1. The planarization layer PN may be formed to surround (e.g., to extend around a periphery of) the light emitting element LD to flatten a step due to the light emitting element LD. In an embodiment, the planarization layer PN may be formed by using an organic insulation material. For example, the planarization layer PN may include at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB). However, the planarization layer PN is not necessarily limited thereto, and the planarization layer PN may further include various suitable types of inorganic insulation materials including a silicon nitride ($SiN_x$), a silicon oxide ($SiO_x$), a silicon oxynitride ($SiO_xN_y$), or an aluminum oxide ($AlO_x$).

Figure 12:
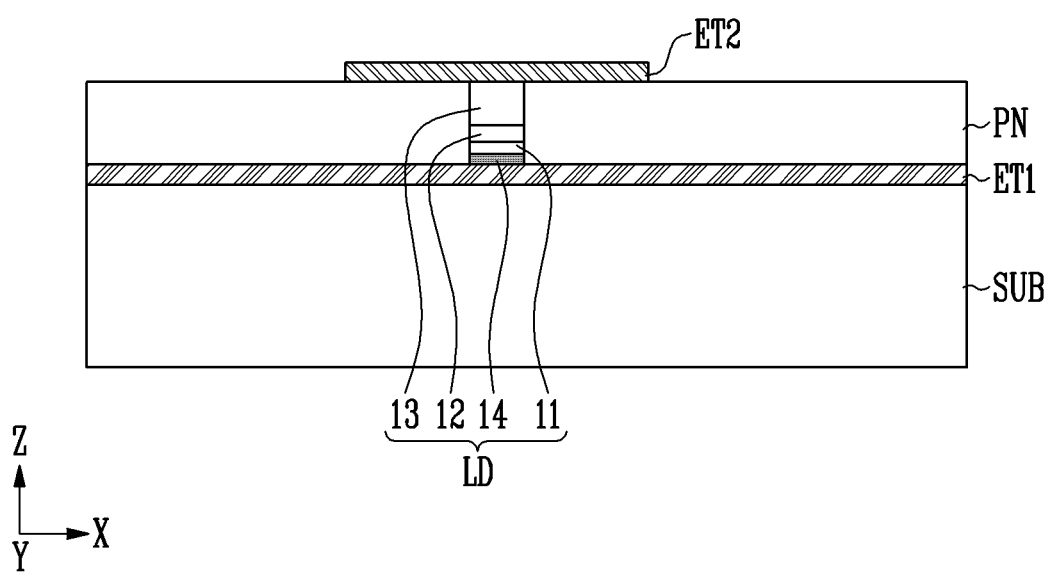

Referring to FIG. 12, the second electrode EL2 is then formed on the planarization layer PN. The second electrode ET2 may be made of an opaque metal or a conductive material having uniform reflectivity. For example, the second electrode ET2 may include at least one of metals such as aluminum (Al), magnesium (Mg), silver (Ag), molybdenum (Mo), platinum (Pt), palladium (Pd), gold (Au), nickel (Ni), neodymium (Nd), iridium (Ir), chromium (Cr), and an alloy thereof but is not necessarily limited thereto.

Figure 13:
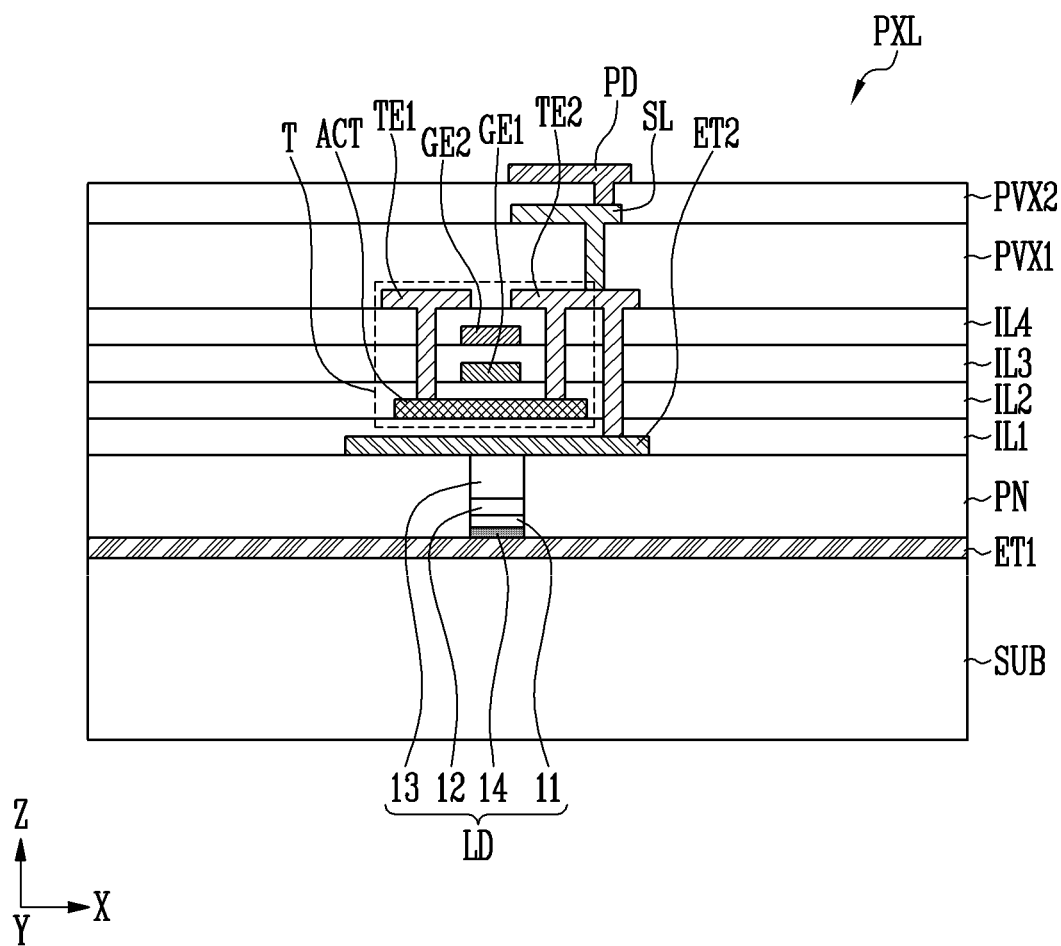

Referring to FIG. 13, the display device shown in FIG. 5 may be completed by forming a transistor T and/or the signal line SL on the second electrode EL2.

The transistor T may be formed to overlap the light emitting element LD on the second electrode ET2 in the third direction (e.g., the Z-axis direction). As described above, when the transistor T is formed to overlap the light emitting element (LD), an area occupied by the transistor T within each pixel PXL may be reduced or minimized so that a high resolution display device may be more easily implemented.

In addition, the signal line SL may be formed in the light emitting area of each pixel PXL. In such an embodiment, the signal line SL may be formed to overlap the second electrode ET2, which is a reflective electrode, in the third direction (e.g., the Z-axis direction). As described above, when the signal line SL is disposed in the light emitting area of the pixel PXL, because a separate space for disposing the signal line SL is unnecessary, the dead space of the display device may be reduced or minimized as previously described.

Those skilled in the art related to the present disclosure will readily appreciate that many modifications are possible without materially departing from the scope of the present disclosure. The embodiments described herein should be considered in a descriptive sense and not for purposes of limitation. The scope of the present disclosure is defined by the appended claims and all differences within the equivalent scope should be construed as being included in the present disclosure.

What is claimed is:

1. A display device comprising:
a substrate;
a transparent electrode on one surface of the substrate;
a reflective electrode on the transparent electrode;
a transistor on the reflective electrode; and
a light emitting element between the transparent electrode and the reflective electrode,
wherein the transistor overlaps the light emitting element in a thickness direction of the substrate, and
wherein the reflective electrode overlaps the transparent electrode in the thickness direction of the substrate.

2. The display device of claim 1, wherein the light emitting element comprises:
a first semiconductor layer;
a second semiconductor layer on the first semiconductor layer; and
a contact electrode between the transparent electrode and the first semiconductor layer.

3. The display device of claim 2, wherein the contact electrode contacts the transparent electrode.

4. The display device of claim 2, wherein the contact electrode comprises the same material as the transparent electrode.

5. The display device of claim 2, wherein the contact electrode comprises at least one of an indium tin oxide, an indium zinc oxide, a zinc oxide, and a zinc tin oxide.

6. The display device of claim 2, wherein the first semiconductor layer is electrically connected to the transparent electrode, and the second semiconductor layer is electrically connected to the reflective electrode.

7. The display device of claim 1, wherein the transparent electrode comprises at least one of an indium tin oxide, an indium zinc oxide, a zinc oxide, and a zinc tin oxide.

8. The display device of claim 1, wherein a width of the reflective electrode is larger than a width of the light emitting element.

9. The display device of claim 8, wherein the reflective electrode covers the light emitting element.

10. The display device of claim 1, further comprising a planarization layer surrounding the light emitting element.

11. The display device of claim 10, wherein the planarization layer is between the transparent electrode and the reflective electrode.

12. The display device of claim 11, wherein the reflective electrode is directly on the planarization layer.

13. The display device of claim 1, wherein the transistor comprises:
a semiconductor layer on the reflective electrode;
a gate electrode on the semiconductor layer; and
a source electrode and a drain electrode on the gate electrode.

14. The display device of claim 13, wherein the reflective electrode is electrically connected to the source electrode or the drain electrode.

15. The display device of claim 1, wherein the substrate has a display area in which the light emitting element is arrange and a non-display area other than the display area, and
wherein the substrate has a pad portion in the display area.

16. The display device of claim 15, wherein the pad portion overlaps the reflective electrode.

17. The display device of claim 1, further comprising a low-resistance conductive layer on the transparent electrode.

18. The display device of claim 17, wherein the low-resistance conductive layer has a mesh shape.

19. The display device of claim 1, further comprising a color conversion layer on another surface of the substrate and overlapping the light emitting element; and
a color filter layer on the color conversion layer.

20. The display device of claim 19, further comprising a light blocking pattern surrounding the color conversion layer or the color filter layer.

21. The display device of claim 1, wherein the transistor comprises:
a semiconductor layer on the reflective electrode;
a gate electrode on the semiconductor layer; and
a source electrode and a drain electrode on the gate electrode, and
wherein the gate electrode overlaps the light emitting element in the thickness direction of the substrate.

* * * * *